United States Patent
Reinold et al.

(10) Patent No.: US 7,581,667 B2
(45) Date of Patent: Sep. 1, 2009

(54) TOOL HEAD FOR ATTACHING AN ELECTRICAL CONDUCTOR ON THE CONTACT SURFACE OF A SUBSTRATE AND METHOD FOR IMPLEMENTING THE ATTACHMENT

(75) Inventors: Manfred Reinold, Schwieberdingen (DE); Thomas Kaden, Schwieberdingen (DE); Dirk Brinkmann, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 415 days.

(21) Appl. No.: 10/682,057

(22) Filed: Oct. 9, 2003

(65) Prior Publication Data
US 2004/0129761 A1 Jul. 8, 2004

(30) Foreign Application Priority Data
Oct. 24, 2002 (DE) .............................. 102 49 569

(51) Int. Cl.
*B23K 1/06* (2006.01)
(52) U.S. Cl. ...................... 228/110.1; 228/1.1; 228/4.5; 156/73.1
(58) Field of Classification Search ................... 228/1.1, 228/4.5, 110.1; 156/73.1, 73.2, 73.4, 73.5, 156/580.1, 580, 580.2; 310/321–323.21
See application file for complete search history.

(56) References Cited

U.S. PATENT DOCUMENTS

| | | | | |
|---|---|---|---|---|
| 3,257,721 A * | 6/1966 | Jones | ........................... | 228/1.1 |
| 3,678,768 A * | 7/1972 | Mansour | ......................... | 74/54 |
| 4,266,710 A * | 5/1981 | Bilane et al. | .................. | 228/4.5 |
| 4,812,697 A * | 3/1989 | Mishiro | .................. | 310/323.12 |
| 5,201,453 A * | 4/1993 | Amador et al. | .......... | 228/110.1 |
| 5,645,681 A * | 7/1997 | Gopalakrishna et al. | . | 156/580.2 |
| 5,662,766 A * | 9/1997 | Ishikawa et al. | .......... | 156/580.2 |
| 5,699,950 A * | 12/1997 | Jang | ........................... | 228/1.1 |
| 5,730,832 A * | 3/1998 | Sato et al. | .................... | 156/499 |
| 5,733,074 A * | 3/1998 | Stock et al. | .................... | 408/17 |
| 5,782,403 A * | 7/1998 | Wang | .......................... | 228/264 |
| 5,944,249 A * | 8/1999 | Macabitas et al. | ......... | 228/180.5 |
| 6,120,629 A * | 9/2000 | Shannon et al. | ............ | 156/73.1 |
| 6,299,051 B1 * | 10/2001 | Tsujino | .................... | 228/110.1 |
| 6,382,494 B1 * | 5/2002 | Miller | ........................ | 228/1.1 |

(Continued)

FOREIGN PATENT DOCUMENTS

DE  93 21 269  2/1997

(Continued)

*Primary Examiner*—Jessica L Ward
*Assistant Examiner*—Michael Aboagye
(74) *Attorney, Agent, or Firm*—Kenyon & Kenyon LLP

(57) ABSTRACT

A tool head for attaching an electrical conductor on the contact surface of a substrate, comprising a vibration exciter for generating linear ultrasonic vibrations; a bonding tool that is able to contact the contact surface and/or the conductor, a contact pressure being able to be applied to the conductor in the direction of the contact point via the bonding tool, and the conductor is able to be welded onto the contact point with the aid of the ultrasonic vibrations able to be transmitted to the contact point and/or the conductor in this manner; and a vibration conductor absorbing the linear ultrasonic vibrations of the vibration exciter; a converter being provided between the vibration conductor and the bonding tool to convert the linear vibrations into radial vibrations in such a way that the bonding tool is able to be incited to rotary vibrations.

7 Claims, 1 Drawing Sheet

U.S. PATENT DOCUMENTS

| | | | |
|---|---|---|---|
| 6,422,448 B2 * | 7/2002 | Kyomasu et al. | 228/1.1 |
| 6,491,785 B1 * | 12/2002 | Sato et al. | 156/379.6 |
| 2002/0130157 A1 * | 9/2002 | Sheehan et al. | 228/1.1 |
| 2005/0285481 A1 * | 12/2005 | Miyazawa | 310/328 |

FOREIGN PATENT DOCUMENTS

JP 2002282787 A * 10/2002

* cited by examiner

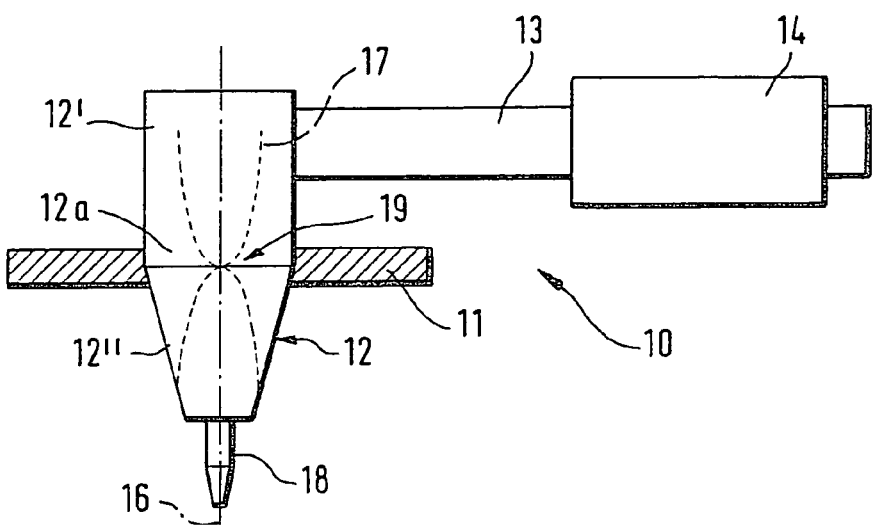
FIG. 1
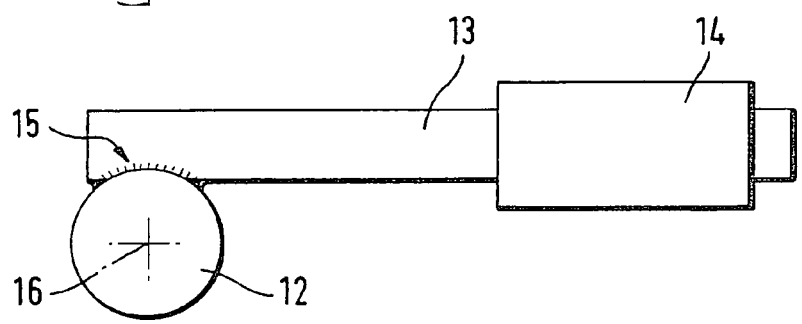
FIG. 2
FIG. 3
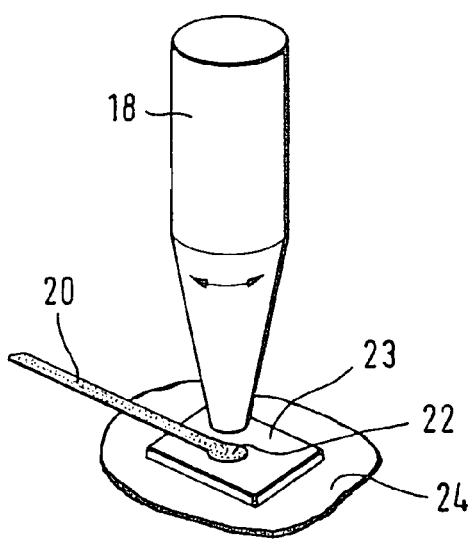
FIG. 4a
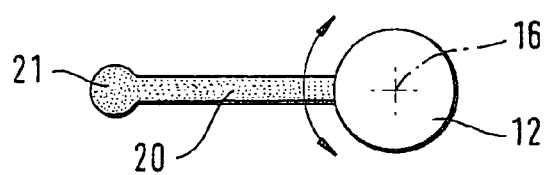
FIG. 4b
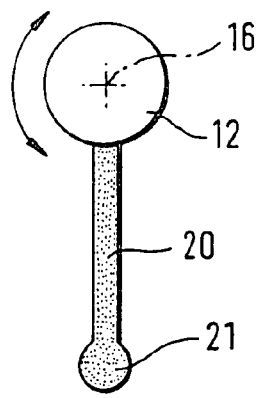

TOOL HEAD FOR ATTACHING AN ELECTRICAL CONDUCTOR ON THE CONTACT SURFACE OF A SUBSTRATE AND METHOD FOR IMPLEMENTING THE ATTACHMENT

BACKGROUND INFORMATION

It is known that electrical conductors must be attached at appropriate contact points on substrates, such as circuit boards, micro-controllers and microprocessors, in order to establish electrical connections to some other contact point.

An electrical conductor is often attached by so-called bonding, which is understood to mean that a continuous material connection between the contact point and the electrical conductor is produced by ultrasonic friction welding. Using selected guidance, a tool head then guides the electrical conductor along a specified path curve to the second contact point, where it is attached in the same manner and then cut off from the supply of the electrical conductor, thereby producing an electrical connection of two contact points of a subassembly, such as a printed board assembly of a control device.

Two basic types of bonding connections are known. In so-called ball bonding, prior to attaching the electrical conductor, material from the electrical conductor is fused onto the first of the two contact points through heat input to the tip of a bonding tool, thereby producing a ball of material that is cohesive with the remaining electrical conductor. This ball may then be joined to the first contact point by bonding or ultrasonic friction welding. In contrast, no ball of material is produced in so-called wedge bonding. The electrical conductor is placed directly on top of the contact point, pressed onto it with a defined contact force, whereupon the ultrasonic energy is introduced to implement the friction welding.

To connect two contact points to an electrical conductor that is supplied continuously, at least one connection is expediently implemented as wedge bond, so that wedge-wedge bonds and ball-wedge bonds are basically conceivable.

In particular in ball-wedge bonding, the ultrasonic energy is introduced via linear vibrations, parallel to the substrate plane. The wedge side of the bond is then more difficult to produce than the ball side. The quality of the bond depends on the material and the surface of the contact point, the topography and the direction from which the ultrasonic energy is introduced. Following the ball-bonding at the first contact point, the tool head may be displaced in any direction relative to the substrate surface. A direction change of the tool, in particular of the bond head, is not required. A specific alignment with respect to the vibration direction of the linear ultrasonic vibrations and the respective travel direction, in particular the final travel direction, and the orientation of the electrical conductor prior to reaching the second contact point is not specified.

When introducing the ultrasonic energy in the production of a wedge bond, it should be noted that the vibration direction of the bonding tool relative to the extension of the electrical conductor has a different effect on the bond quality in the region of the contact point. Depending on the direction from which energy is introduced (angle between wire and vibration direction), correction factors for the possibly occurring power loss must be taken into account. The alignment of the bonding tool with respect to the extension of the conductor in the region of the contact point requires additional displacement movements of the tool head, thus causing a longer displacement time of the tool head. This increases both the manufacturing time and the production cost. On the other hand, estimating and taking the power loss into account is not sufficiently reliable to produce bonds that are strong and durable under all circumstances.

Therefore, it is an object of the present invention to provide a device and a method for producing high-quality bonding connections. In particular, it is an objective to realize the lowest possible machining period in so-called ball-wedge bonding.

SUMMARY OF THE INVENTION

A tool head for attaching an electrical conductor on a contact point of a substrate through ultrasonic friction welding or bonding has a vibration exciter for generating linear ultrasonic vibrations, and a vibration conductor (transducer) for transmitting the linear ultrasonic vibrations to the bonding tool that is able to contact the attachment point. Using a defined contact pressure, the bonding tool presses the electrical conductor to be attached onto the contact surface. According to the present invention, a converter is disposed between the vibration conductor and the bonding tool, the converter converting the linear vibrations into rotary vibrations (torsion).

Via its bonding tool, a tool head according to the present invention performs rotary oscillations, i.e., torsional movements. The energy of these vibrations is always able to be transmitted in the same way and at the same transmission rate, regardless of the orientation of the electrical conductor relative to the bonding tool. This makes it possible to produce ultrasonic friction welds in a uniform and controlled manner, allowing a satisfactory, uniform bond quality to be achieved. An alignment of the bonding tool with respect to the line extension of the electrical conductor is also not required according to the present invention, thus dispensing with displacement movements of the tool head, which prolong the machining period. In this way, the quality of a wedge bond, for example, is improved while the required machining time is reduced at the same time. Simultaneously, a good bond quality is also ensured when producing a ball-bond, since the transmission of the rotational movements of the ball produced at the attachment point by the rotary vibrations of the bonding tool occurs precisely at the set-down point of the ball of material (ball). In this way, a locally restricted heat generation and a good attachment of the ball of material on the contact surface are ensured.

According to an advantageous development of the present invention, the converter is a component that is dynamically balanced with respect to a center axis. In this case, the vibration conductor is laterally secured on the outside of the converter and aligned perpendicularly with the center axis. Linear movements of the vibration conductor in its direction of extension cause a rotary motion of the converter about its center axis. The vibration conductor may be secured on the converter in particular by welding or hard-soldering. To the extent that heating occurs in the region of the bonding site as a result of the transmitted energy, the bonding site may also be cooled, it being possible, in particular, to generate an air flow in this region for this purpose.

The converter may, in particular, have a cylindrical base element having a circular frustoconical tool shaft facing the substrate. According to a further refinement of the present invention, the bonding tool may then be secured to the converter in such a way that it projects beyond the region of the tool shaft and is aligned with the center axis of the converter. This also advantageously makes it possible to position the bonding tool in a centrical manner with respect to the contact surface. It will then not perform any linear vibration lifts relative to the contact surface and is thus able to be oriented in a simple and reliable manner.

According to an advantageous refinement, the converter, in a region of its body, is supported in a play-free manner by a tool support in which amplitude-free nodes of vibration form in the frequency of the vibration excitation via the vibration exciter. Choosing this mounting site has the result, on the one hand, that the rotary vibrations occur precisely about the center axis of the converter. On the other hand, the mounting site is free of vibration excitations and thus exposed to merely low stresses. The heat generation in the mounting region is kept to a minimum. The mounting of the converter in the tool support may be implemented by shrink-fitting, in particular, the tool support enclosing the converter circumferentially.

According to an advantageous embodiment it is provided in this context that the vibration conductor is secured on the converter and freely projects beyond it, the vibration exciter being held on the vibration conductor, in particular. No further affixation of the vibration exciter or vibration conductor on the tool support is necessary. This type of attachment prevents that vibration excitations are introduced into the tool support, which would cause interference and result in a power loss.

The supply of the electrical conductor to be contacted is preferably implemented via a supply channel to the bonding tool, formed in the converter, preferably along the center axis. The conductor may be guided and advanced therein in the usual manner, by air flow.

The method according to the present invention for attaching an electrical conductor on the contact surface of a substrate provides for a vibration inciter to generate linear ultrasonic vibrations, which are transmitted to a bonding tool via a vibration conductor. The bonding tool presses the electrical conductor onto the contact surface of the substrate, using a defined contact force. Ultrasonic vibrations are generated, which supply the energy required for the friction-welded connection (bond connection). According to the present invention, the linear vibrations are converted into rotary vibrations in a converter, in such a way that the bonding tool performs rotary vibrations.

BRIEF DESCRIPTION OF THE DRAWINGS

FIG. 1 shows a side view of a preferred specific embodiment of a tool head configured according to the present invention.

FIG. 2 shows a plan view of the tool head configured according to FIG. 1.

FIG. 3 shows a representation illustrating the production of a wedge bond on a substrate.

FIGS. 4a and 4b show sketch-type representations to illustrate the independence of the bond formation from the orientation of the electrical conductor according to the present invention.

DETAILED DESCRIPTION

FIGS. 1 and 2, in a side view and a plan view, show a preferred specific embodiment of a tool head configured according to the present invention, which in this case is denoted overall by reference numeral 10. Tool head 10 has a converter 12, which is held on a tool support 11. Tool support 11 encloses converter 12 in circumferential manner. Converter 12 may be secured on tool support 11 by shrink-fitting, for example. Provided in the upper region of converter 12 is a vibration conductor 13, which is joined to converter 12 via a hard-solder or welding connection 15. Vibration conductor 13 has a rod or tubular design and is secured laterally on the outside of, i.e., tangentially to, converter 12. A vibration exciter 14 is arranged in the region of the free end of vibration conductor 13. Vibration exciter 14, which is embodied as a piezo-crystal body, for example, is able to be excited to linear vibrations of a specified or desired frequency in the ultrasonic range by an electric AC voltage having a predefined frequency, for example. The generated vibrations are transmittable to converter 12 via vibration conductor 13.

A bonding tool 18 is supported in the lower region of converter 12.

Due to the lateral external mounting of vibration conductor 13 on converter 12 and its play-free affixation on tool support 11, the linear vibrations present in vibration conductor 13 are converted in converter 12 into rotary vibrations relative to its center axis 16. The frequency of the rotary vibrations corresponds to the frequency of the linear vibrations generated by vibration exciter 14.

Tool support 11 encloses converter 12 in a region 12a in which a node of vibration forms in the excitation frequency of the vibration excitation. For illustration purposes, this node of vibration is shown in FIG. 1 and denoted by 19. The amplitude of the vibrations generated by converter 12 is also schematically shown, by amplitude curve 17, which is drawn in as a dotted line and includes node of vibration 19. It should be pointed out that amplitude curve 17 is illustrated merely for the purpose of representation to clarify the amplitude situation. In reality, a more differentiated vibration characteristic and, in particular, a greater number of nodes of vibration, will occur.

As can be inferred from FIGS. 1 and 2, converter 12 has a dynamically balanced design with respect to its center axis 16, an in particular frustoconically tapering section 12" lying adjacent to an upper cylindrical section 12'. The transition area between regions 12' and 12" corresponds to the already mentioned region 12a in which the mounting of converter 12 on tool support 11 is realized.

The rotary vibrations of converter 12 generated in this manner also excite rotary vibrations in bonding tool 18. Bonding tool 18 is aligned with center axis 16 of converter 12 and projects beyond the lower edge of region 12" of converter 12.

Tool head 12 is designed to include guidance means (not shown) to execute displacement operations for adjusting a desired placement relative to a substrate. Corresponding supply lines for energy, material and, if appropriate, cooling may also be conveyed to tool head 10 via the guidance device (not shown) or else via tool support 11.

FIG. 3 is intended to illustrate the production of a wedge bond, using the tool head shown in FIGS. 1 and 2. It is assumed that a wedge bond is to be produced in the region of an attachment point (contact point or surface) 23 of a substrate 24. To this end, an electrical conductor 20 is brought to attachment point 23 with the aid of bonding tool 18. Bonding tool 18 then presses electrical conductor 20 onto contact point 23, using a defined contact force. Vibration exciter 14 generates (linear) vibrations for a specific time interval. Because of the vibrations, transmitted as described above and converted into rotary vibrations, friction welding occurs between contact point 23 and conductor 20. The affixation of the conductor, the so-called bond, which is denoted by 22 in this case, is thus completed. If the attachment point is, for example, the second attachment point of the conductor on the substrate, the electrical conductor is cut off directly beyond the bonding site, a preset breaking point between the continuing conductor and the welding point having been produced during the bonding procedure (frictional welding) already. The bond shown thus is a wedge bond 22.

FIGS. 4a and 4b show various placements of a conductor 20 on a contact point (not shown). The respective first end of conductor 20 is embodied as ball bond 21 here, the respective second end is covered by converter 12 in the representations of FIGS. 4a, 4b. It is assumed that the non-visible bond formed underneath converter 12 is implemented as wedge bond. Since the rotary vibrations of converter 12, or of bonding tool 18, which is connected thereto but not shown here, are implemented about axis of rotation 16 in a rotationally symmetrical manner, an essentially identical energy coupling into conductor 20 takes place in the two shown placements of conductor 20. This makes it possible to ensure a uniform quality of the wedge bonds, regardless of the orientation of conductor 20.

Taking into account correction factors as a function of the direction of extension of the conductor or wire 20, as these were mentioned before with reference to the related art, is no longer necessary. Since the quality of the wedge bond connections able to be obtained according to the present invention is uniformly good, it is possible to dispense with additional safety bonds in the form of ball bonds, which were bonded onto a wedge bond according to the related art. In this way, an overall lower wire or conductor use accompanied by higher machining periods may be realized.

What is claimed is:

1. A method for attaching an electrical conductor on a contact surface of a substrate, comprising:
generating linear ultrasonic vibrations in a direction approximately parallel to the contact surface of the substrate; and
converting the linear ultrasonic vibrations into rotary vibrations, using a converter, and introducing the rotary vibrations into at least one of the contact surface and the conductor in order to produce a permanent bond between the contact surface and the conductor, the rotary vibrations being incited about an axis of rotation of a bonding tool, the axis of rotation of the bonding tool being approximately coincident with a torsional axis of rotation of the converter and oriented approximately perpendicular to the contact surface of the substrate.

2. The method according to claim 1, wherein the method is performed using a tool head.

3. A tool head for attaching an electrical conductor on a contact surface of a substrate, comprising:
a vibration exciter for generating linear ultrasonic vibrations;
a bonding tool adapted to contact at least one of the contact surface and the conductor, the contacting applying a contact pressure to the conductor in a direction of the contact surface via the bonding tool, the conductor being adapted to be welded onto the contact surface with the aid of ultrasonic vibrations transmitted to at least one of the contact surface and the conductor;
a vibration conductor absorbing the linear ultrasonic vibrations of the vibration exciter; and
a converter situated between the vibration conductor and the bonding tool to convert the linear vibrations into torsional vibrations such that the bonding tool is able to be incited to rotary vibrations about a tool axis of rotation, the tool axis of rotation being approximately coincident with a torsional axis of rotation of the converter and oriented approximately perpendicular to the contact surface of the substrate;
wherein the vibration exciter generates linear ultrasonic vibrations in a direction approximately parallel to the contact surface of the substrate; and
wherein the converter is a component dynamically balanced with respect to a center axis of the converter, the vibration conductor being laterally secured on a side of the converter so that a center axis of the vibration conductor is oriented perpendicularly to the center axis of the converter.

4. The tool head according to claim 3, wherein the bonding tool is secured at one end in the center axis of the converter.

5. The tool head according to claim 3, wherein the converter has, across its body, regions of nodes of vibration with respect to introductory rotary vibrations, in which a vibration amplitude of the rotary vibrations is zero, the converter being held without play in a tool support in a region of at least one node of vibration.

6. The tool head according to claim 5, wherein the vibration conductor and the vibration exciter project freely from the converter.

7. A tool head for attaching an electrical conductor on a contact surface of a substrate, comprising:
a vibration exciter for generating linear ultrasonic vibrations;
a bonding tool adapted to contact at least one of the contact surface and the conductor, the contacting applying a contact pressure to the conductor in a direction of the contact surface via the bonding tool, the conductor being adapted to be welded onto the contact surface with the aid of ultrasonic vibrations transmitted to at least one of the contact surface and the conductor;
a vibration conductor absorbing the linear ultrasonic vibrations of the vibration exciter; and
a converter situated between the vibration conductor and the bonding tool to convert the linear vibrations into torsional vibrations such that the bonding tool is able to be incited to rotary vibrations about a tool axis of rotation, the tool axis of rotation being approximately coincident with a torsional axis of rotation of the converter and oriented approximately perpendicular to the contact surface of the substrate, wherein the electrical conductor is fed to the bonding tool through the converter, through a feed channel.

* * * * *

UNITED STATES PATENT AND TRADEMARK OFFICE
CERTIFICATE OF CORRECTION

PATENT NO. : 7,581,667 B2  
APPLICATION NO. : 10/682057  
DATED : September 1, 2009  
INVENTOR(S) : Reinold et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 556 days.

Signed and Sealed this

Fourteenth Day of September, 2010

David J. Kappos
*Director of the United States Patent and Trademark Office*